United States Patent [19]

Mangelsdorf

[11] Patent Number: 4,924,227
[45] Date of Patent: May 8, 1990

[54] PARALLEL ANALOG-TO-DIGITAL CONVERTER

[75] Inventor: Christopher W. Mangelsdorf, Reading, Mass.

[73] Assignee: Analog Devices, Inc., Norwood, Mass.

[21] Appl. No.: 283,791

[22] Filed: Dec. 13, 1988

[51] Int. Cl.⁵ .............................................. H03M 1/36
[52] U.S. Cl. .................... 341/159; 341/155; 341/158
[58] Field of Search ............... 341/155, 156, 157, 158, 341/159, 160, 161; 307/360, 361, 362, 363

[56] References Cited

U.S. PATENT DOCUMENTS

| | | | |
|---|---|---|---|
| 4,229,729 | 10/1980 | Devendorf et al. | 341/159 |
| 4,270,118 | 5/1981 | Brokaw | 340/347 |
| 4,386,339 | 5/1983 | Henry et al. | 340/347 |
| 4,816,831 | 3/1989 | Mizoguchi et al. | 341/156 |
| 4,839,653 | 6/1989 | Devito | 341/157 |

OTHER PUBLICATIONS

R. E. J. Van de Grift and M. Van der Veen, *Session IX: High-Speed ADCs: 8b 50 MHz with Folding and Interpolation Techniques*, Report of 1987 IEEE International Solid-State Circuits, Conference Held on Feb. 25, 1987.
R. van de Plassche, P. Baltus, *Session XV: A/D Conversion: An 8b 100 MHz Folding ADC*, Report on the 1988 IEEE International *Solid State Circuits* Conference Held on Feb. 19, 1988.
R. E. J. Van de Grift, I. W. J. M. Rutten and M. Van der Veen, *An 8-Bit Video ADC Incorporating Folding and Interpolation Techniques*, IEEE Journal of Solid-State Circuits, vol. sc-22, No. 6, Dec. 1987.
I. Rutten, R. van de Grift, M. van de Veen, *A High-Performance 8-Bit 55 MHz Flash-AC for Video and Professional Applications*, IEE Colloquim (1987).

*Primary Examiner*—William M. Shoop, Jr.
*Assistant Examiner*—Brian K. Young
*Attorney, Agent, or Firm*—Wolf, Greenfield & Sacks

[57] ABSTRACT

The apparatus comprises a parallel analog-to-digital converter comprising a matrix of differentially coupled transistor pairs wherein the base of one transistor of each differential pair is coupled to a reference voltage and the base of the other transistor of each differential pair is coupled to the input voltage through a specified offset. In each row of differential pairs, the collectors of the transistors are alternately coupled to first and second row output points. The first and second row output points of each row are coupled to the inverting and non-inverting inputs, respectively of a comparator. Additional comparators are provided for comparing the second row output of each row with the first row output of the succeeding row. The matrix is arranged such that the combination of the comparator outputs is unique for each possible digital level in the full scale range of the converter. Logic circuitry is coupled to the comparator outputs to produce a computer usable code therefrom.

14 Claims, 7 Drawing Sheets

FIG. 1

| SIX | BIT | GRAY | | CODE | | DECIMAL NO. |
|---|---|---|---|---|---|---|
| 0 | 0 | 0 | 0 | 0 | 0 | 0 |
| 0 | 0 | 0 | 0 | 0 | 1 | 1 |
| 0 | 0 | 0 | 0 | 1 | 1 | 2 |
| 0 | 0 | 0 | 0 | 1 | 0 | 3 |
| 0 | 0 | 0 | 1 | 1 | 0 | 4 |
| 0 | 0 | 0 | 1 | 1 | 1 | 5 |
| 0 | 0 | 0 | 1 | 0 | 1 | 6 |
| 0 | 0 | 0 | 1 | 0 | 0 | 7 |
| 0 | 0 | 1 | 1 | 0 | 0 | 8 |
| 0 | 0 | 1 | 1 | 0 | 1 | 9 |
| 0 | 0 | 1 | 1 | 1 | 1 | 10 |
| 0 | 0 | 1 | 1 | 1 | 0 | 11 |
| 0 | 0 | 1 | 0 | 1 | 0 | 12 |
| 0 | 0 | 1 | 0 | 1 | 1 | 13 |
| 0 | 0 | 1 | 0 | 0 | 1 | 14 |
| 0 | 0 | 1 | 0 | 0 | 0 | 15 |
| 0 | 1 | 1 | 0 | 0 | 0 | 16 |
| 0 | 1 | 1 | 0 | 0 | 1 | 17 |
| 0 | 1 | 1 | 0 | 1 | 1 | 18 |
| 0 | 1 | 1 | 0 | 1 | 0 | 19 |
| 0 | 1 | 1 | 1 | 1 | 0 | 20 |

| NODE | VOLTS |
|---|---|
| 40a | 5.55 |
| b | 4.75 |
| c | 3.95 |
| d | 3.15 |
| e | 2.35 |
| f | 1.55 |
| g | 0.75 |
| h | −0.05 | h) SAME AS NODE 30

FIG.4A

| NODE | VOLTS |
|---|---|
| 36a | 0.4 |
| b | 0.3 |
| c | 0.2 |
| d | 0.1 |
| e | 0.0 |
| f | −0.1 |
| g | −0.2 |
| h | −0.3 |

COMPARATOR FRONT END

PARALLEL ANALOG-TO-DIGITAL CONVERTER

FIELD OF THE INVENTION

The invention relates to parallel analog-to-digital converters, more commonly known as flash converters. More particularly, the invention relates to high resolution flash converters utilizing differential transistor pairs as level sensors.

BACKGROUND OF THE INVENTION

A conventional parallel analog-to-digital converter compares an analog input signal to a series of equally spaced reference voltages. Typically, the reference voltages are produced by a single voltage source and a voltage divider circuit such as a resistive ladder to provide the multiple reference voltage levels. The comparisons are usually provided by a bank of latched comparators. When an analog input signal is present at the input of the comparator bank, all comparators for which the input reference voltage exceeds the analog input voltage produce a low output while the comparators which have a reference voltage input which is below the analog input have a high output. The number of comparators outputting a high voltage level defines the digital output of the device. The outputs of the comparator bank are then encoded to produce a digital output. The encoding logic can produce a standard binary, Gray code or other type of binary coded digital output.

A typical n bit flash converter requires $2^n - 1$ comparators. Therefore, a flash converter having eight bits of resolution would require 255 comparators, and a comparable amount of associated logic. In comparison to other types of analog-to-digital converters, it can be seen that flash converters require substantially more power, size, wiring and cost. However, on the other hand, since the comparisons are carried out in parallel rather than sequentially, flash converters are substantially faster and can operate at substantially higher frequencies than most other types of analog-to-digital converters.

An improved type of parallel analog-to-digital converter is disclosed in U.S. Pat. No. 4,270,118 issued to Brokaw and entitled PARALLEL ANALOG TO DIGITAL CONVERTER which is owned by the same assignee as the present application. The disclosure of that patent is incorporated herein by reference. That patent discloses a method and mean for reducing the number of comparators necessary in a parallel analog-to-digital converter. The device uses a ladder of differentially coupled transistor pairs. The base of a first transistor of each differential pair is coupled to the input signal (hereinafter called the input transistor). The base of the second of the transistors in each differential pair is coupled to a reference voltage source (hereinafter called the reference transistor). Each differential pair is supplied with a different reference voltage such that the voltage levels are equally spaced by a voltage corresponding to the value of one LSB (least significant bit) apart. The emitters of the two transistors in each differential pair are coupled together and connected to a current sink. The collectors of one of the transistors of the differential pairs are all coupled to a first common point, while the collectors of the other transistors of the differential pairs are all coupled to a second common point. The connections of consecutive differential pairs, however, are alternated such that, if in one differential pair the transistor which has its base coupled to the reference voltage has its collector coupled to the first collector common point, in the adjacent differential pairs, the transistor having its base coupled to the reference voltage has its collector coupled to the second collector common point. This will hereinafter be referred to as interleaving or cross-coupling.

Each differential pair draws a constant current into the current sink, but the amount of current into the current sink drawn through each of the two transistors of the pair depends upon the relative base voltages of the two transistors. As the base voltage of the input transistor of a differential pair (i.e., the input voltage) increases and exceeds the reference voltage supplied at the base of the reference transistor of that differential pair, the input transistor conducts more current through its collector-emitter path than the reference transistor. The opposite holds true for those differential pairs where the input voltage is less than the reference voltage. As each reference threshold of a differential pair is crossed by the input signal, the input transistor will conduct more than the reference transistor, thus increasing the current drawn through the particular collector common point to which its collector is coupled. Thus, since the collectors of the transistors of each differential pair are cross-coupled, as the input crosses the reference voltage threshold of each differential pair (which are set one LSB apart, as noted previously), a greater current is alternately drawn first from one collector common point and then from the other. These collector common points are coupled to the inputs of a comparator. Thus, the output of the comparator switches state every time the input signal crosses a reference threshold.

U.S. Patent Application Ser. No. 07/196,035 of the same inventor as the present application and assigned to the same assignee as the present application, is also incorporated herein by reference.

The parallel analog-to-digital converters of the prior art generally require $2^n - 1$ comparators to provide n bits of resolution. Additionally, they require at least $2^n - 1$ resistors and other associated circuitry. The Brokaw invention, U.S. Pat. No. 4,270,118 requires $2^n - 1$ differential pairs and a substantial number of resistors and other circuit components. In addition to the large size and high cost of producing such parallel analog-to-digital converters, the linearity of such converters is frequently unacceptable due to the difficulty and cost of perfectly matching the large numbers of resistors that are required.

It is an object of the present invention to provide an improved parallel analog to digital converter.

It is another object of the present invention to provide a parallel analog-to-digital converter which utilizes fewer comparators for a given resolution than is known in the prior art.

It is yet another object of the present invention to provide a parallel analog-to-digital converter utilizing differential pairs which requires fewer differential pairs than is known in the prior art.

It is a further object of the present invention to provide a parallel analog to-digital converter comprising a matrix of differential pairs.

It is one more object of the present invention to provide a parallel analog-to-digital converter providing additional resolution without the need for additional differential pairs.

It is yet another object of the present invention to provide a parallel analog to-digital converter which utilizes fewer reference voltage levels and therefore fewer resistors than prior art devices.

It is a further object of the present invention to provide a parallel analog-to-digital converter having improved linearity.

It is another object of the present invention to provide a parallel analog-to-digital converter in which it is practical to laser-trim the resistors to provide increased linearity since there are fewer resistors than in the prior art.

SUMMARY OF THE INVENTION

The invention comprises a series of differentially connected transistor pairs arranged in a matrix of rows and columns. The base of one transistor of each differential pair, termed the reference transistor, is coupled to receive a specified reference voltage. The other transistor of each differential pair is coupled to receive the input voltage through a specified voltage offset. Each row of differential pairs has at least one comparator associated therewith.

In each row of differential pairs, successive input transistors have their collectors alternately coupled to a first row output point and a second row output point while successive reference transistors have their collectors alternatively coupled to the second row output point and first row output point. The first and second row output points are coupled, respectively, to the inverting and non-inverting inputs of a row comparator. The emitters of all of the transistors are coupled to current sink circuits.

In any given row of the differential pair matrix, the input transistors receive the same voltage at their bases (i.e., the input offset by the same value). Also, in any given row, each reference transistor receives a greater reference voltage than the preceding reference transistor in that row. For any given column, the reference transistors all receive the same reference voltage. However, for any given column, each input transistor receives a greater offset than the preceding transistor in that column. The magnitude by which the reference voltage for each column is offset from the adjacent columns is chosen so as to provide several evenly spaced voltage levels or thresholds that are a specified number of LSBs apart. Additionally, the offsets of the input voltage are selected so as to offset each row from the adjacent rows by a specified interval, such as one LSB. Each row of differential pairs will cause the inputs of that row s comparator to switch polarity with respect to one another at specified intervals, thereby causing the output of the comparator to switch states. In effect, the output of each row s comparator switches state at specified intervals as the input increases from zero to full range. The outputs of the comparators are coupled to logic circuitry which converts the comparator outputs to a Gray code.

Further, in the present invention, the resolution of a parallel converter is doubled without requiring additional differential pairs by providing an additional comparator between each row comparator for interpolation of adjacent row outputs. Each of these additional comparators compares the second row output point of a row of differential pairs with the first row output point of the succeeding row of differential pairs. The point at which the second row output of a differential pair row reverses polarity with respect to the first row output of the succeeding differential pair row is halfway between the row thresholds of those two differential pair rows. With this type of interpolation, the resolution of the converter is doubled without providing any additional differential pair.

The invention will be better understood when the following detailed description is read in conjunction with the drawing.

DETAILED DESCRIPTION OF THE INVENTION

Figure 1:
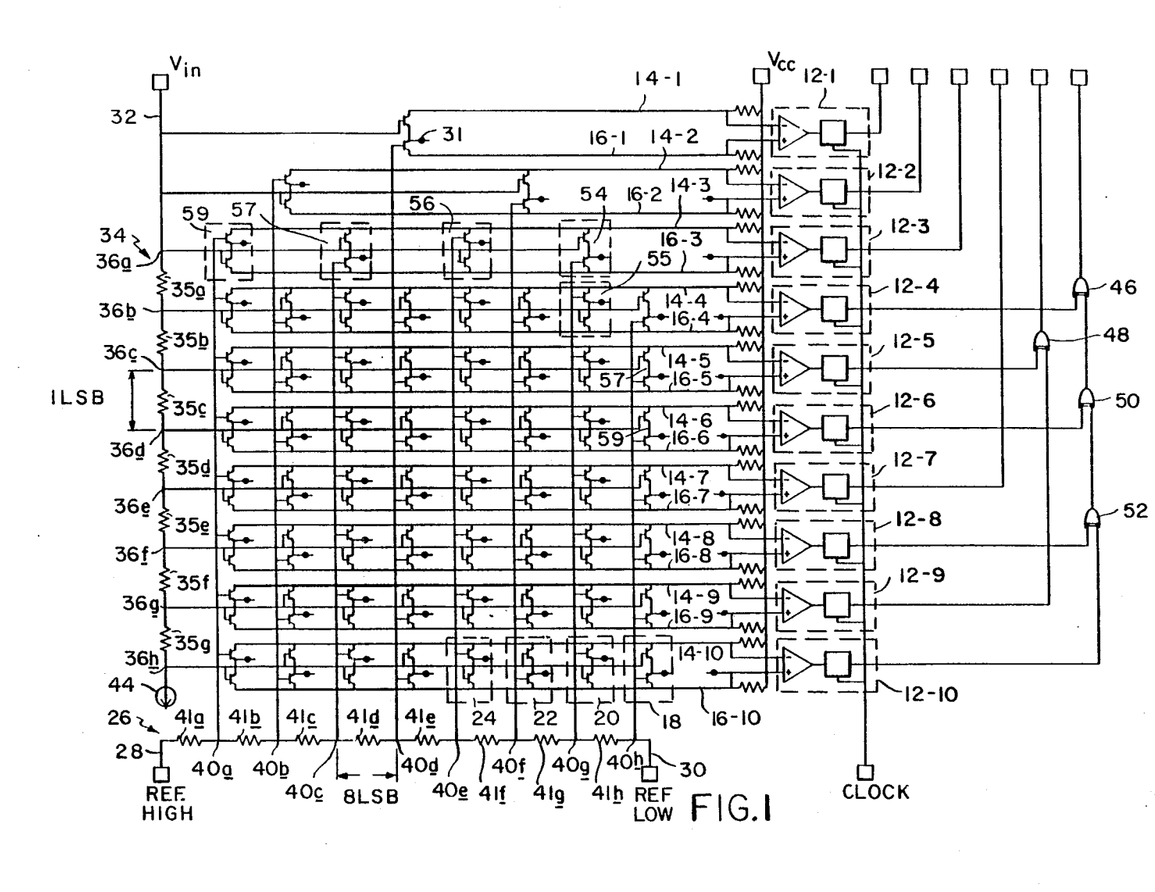
FIG. 1 is a schematic circuit diagram showing the differential pair matrix of the present invention used in a flash converter arrangement.
Figure 2:
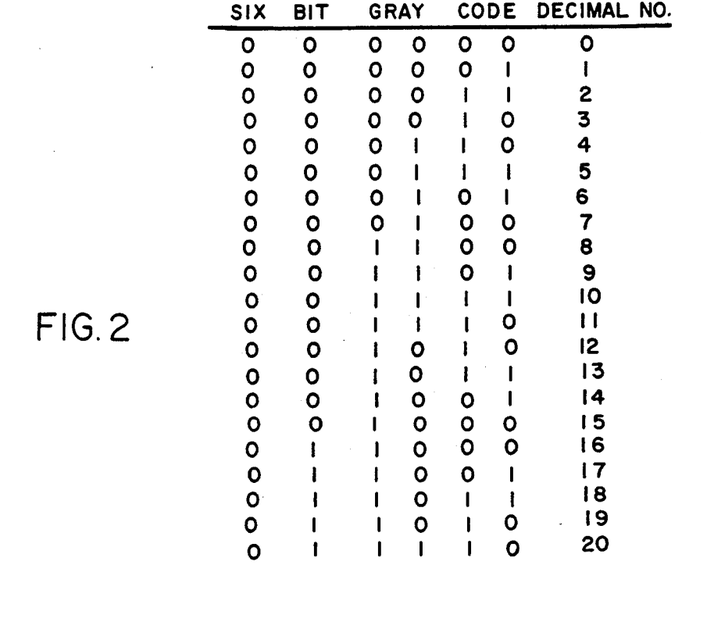
FIG. 2 is a table of Gray codes.

FIG. 1 shows a first level embodiment of the parallel analog-to-digital converter of the present invention. This particular embodiment has six bits of resolution which are output in a Gray code. It should be understood, however, that the invention can be extended to any number of bits of resolution and the output may be represented in other types of binary codes rather than Gray code. A table of Gray codes is shown in FIG. 2. The matrix itself also may be adapted to different formats which more easily accommodate different types of binary coding.

The converter comprises ten latched comparators 12. The lower seven comparators, 12-4 through 12-10, receive inputs at the inverting and non inverting inputs from identical rows of differential pairs. The outputs of comparators 12-4 through 12-10 are combined through logic circuitry to produce the three least significant bits of the output Gray code. The top three comparators, 12-1 through 12-3, directly output the three most significant bits of the output Gray code. The inputs of comparators 12-1 through 12-3 are also coupled to rows of differential pairs, however, these rows are modified versions of the lower seven rows. Hereinafter, the rows will be referred to as rows 1 through 10, with row 1 being the top row in FIG. 1. The columns will be referred to as columns A through H, with column H being the rightmost column in FIG. 1. The structure and operation of the seven lower rows, rows 4–10, will be described first.

Referring to exemplary row 10 of the differential pair matrix of FIG. 1, it can be seen that the rows of the matrix are similar to the flash converter disclosed in U.S. Pat. No. 4,270,118, discussed above. In each differential pair, the emitters are tied together and coupled to a current sink (not shown, but represented as a dot, such as dot 21, in FIGS. 1 and 6). In each row of the differential pairs, the collectors of a first one of the transistors of the multiple differential pairs in that row are coupled together to a first row output point 14-n. The collectors of the other transistors of the differential pairs in the row are coupled to a second row output point 16-n. First row output point 14 n is coupled to the inverting input of comparator 12-n associated with the row, while second row output point 16-n is coupled to the non-inverting input of the same comparator 12-n. All second row output points 16-n are also coupled to current sinks (not shown but represented by dots) except for the row 1 output point 16-1. Therefore, when the signal at second row output point 16-n exceeds the signal at first row output point 14-n, the output of the comparator 12-n is low. Alternately, when the voltage at row output point 14-n is greater than the voltage at row output point 16-n, the output of comparator 12-n of that row is high.

In exemplary differential pair 18 of FIGS. 1 and 2 (column H, row 10), the transistor 52 which has its collector 63 coupled to the second row output point 16-10 has its base 67 coupled to receive a reference voltage and the transistor 50 having its collector 64 coupled to first row output point 14-10 has its base 69 coupled to receive the input voltage through a specified offset. In differential pair 20 (in column G, row 10), the base connections are reversed, i.e., the transistor having its collector coupled to first row output point 14-10 has its base coupled to receive a reference voltage and the transistor having its collector coupled to second row output point 16-10 has its base coupled to receive the offset input voltage. Moving from right to left along row 10 of FIG. 1, the differential pairs follow this alternating pattern of base connections of the transistors. Thus, differential pair 22 is connected similarly to differential pair 18, while differential pair 24 is connected similarly to differential pair 20. Rows 4–9 are essentially identical to row 10.

A resistive ladder voltage divider 26 provides the multiple reference inputs for the bases of the transistors. Specified voltages are provided at nodes 28 and 40H. In this particular example, the voltage sources are selected so as to provide a voltage difference of eight LSBs between adjacent nodes. The resistive ladder comprises eight resistors of equal value, resistors 41A–41H, with a node between each adjacent pair of resistors, nodes 40A–40H, such that the voltages at the nodes comprise a set of equally spaced reference voltages. These node voltages are the reference voltages described above which are provided to the bases of the transistors in the corresponding column of the differential pair matrix.

A second voltage dividing resistive ladder 3 provides offset values of the input voltage. Input resistive ladder 34 comprises seven resistors 35A–35F of equal value with nodes disposed between each pair of adjacent resistors. The input signal is provided to the ladder at node 32. A constant current source 44 is provided within the ladder. Current source 44 is set to draw a current that will cause the voltage difference between the adjacent nodes of the input resistive ladder to be equal to the desired LSB of the converter. The voltages at these nodes are provided to the bases of the transistors in the differential pairs as the offset input voltage. It can be seen from FIG. 1 that those transistors in rows 1–3 having bases coupled to node 36A receive the full input voltage. Those transistors having bases coupled to node 36B (i.e., the transistors in row 4), however, receive the input voltage negatively offset by one LSB, and so forth down the ladder.

Referring now to the reference voltage resistive ladder 26, those transistors coupled to node 40A receive the voltage at node 28 negatively offset by 8 LSBs, while those transistors coupled to node 40B receive the voltage at node 28 negatively offset by 16 LSBs, and so forth down the ladder.

Figure 3:
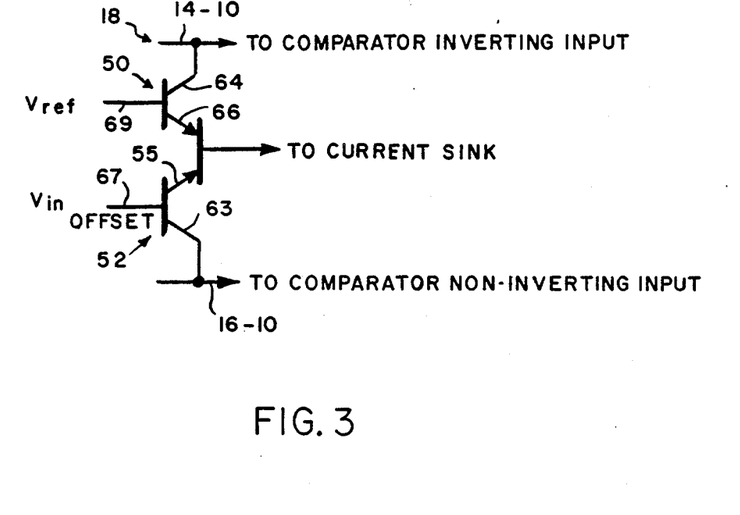
FIG. 3 is a schematic circuit diagram providing a detailed view of a single differential pair of the present invention.

The operation of a differential pair of the present invention will now be described with respect to FIG. 3. Each transistor 50 and 52 of differential pair 18 in FIG. 3 draws current through its collector-emitter path from the collector 63 and 64 to the emitter 65 and 66, respectively. The outputs of the emitters 65 and 66 are sent to a current sink. The collectors of the transistors 63 and 64 are coupled to the first and second output rows 14-10 and 16-10 as described above. As disclosed in U.S. Pat. No. 4,270,118 assigned to the same assignee as the present invention and incorporated herein by reference, assuming a closed circuit to a negative supply from the current sink emitters, a constant current is drawn through each differential pair. However, the portion of the current drawn by each transistor of the pair is directly related to the relative base voltages of the two transistors. For instance, in FIG. 3, if Vref is greater than Vin, then transistor 50 draws more current through first output row point 14-10 than transistor 52 draws through second output row point 16-10. If this is the only transistor pair hooked up to output rows points 14-10 and 16-10, this would cause the associated comparator 12-10 to have more current drawn from its inverting input than from its non inverting input. In turn, this would cause the comparator output to go low.

Figure 4A:
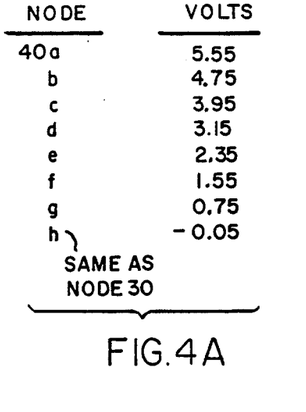
FIGS. 4A and 4B are tables of example reference and input voltages, respectively.

Referring again to FIG. 1, the operation of the matrix of differential pairs can now be described. As mentioned above, the circuit of FIG. 1 is designed to provide six bits of resolution, or 64 different levels. Assuming that the desired full scale input range of the converter is 0–6.3 volts, the reference voltages at nodes 28 and 40H are set to 6.25 volts and −0.05 volts, respectively. The voltages produced at nodes 40A–40H are given in FIG. 4A. When the input voltage is below −0.05 volts (i.e., less than the voltage at any of nodes 40A–40H), the first and second row outputs 14-n and 16-n of each row are equal since, for each row, there are four differential pairs drawing the majority of current from row output point 14 and four other differential pairs drawing the majority of current from row output point 16. However, the non-inverting input of the comparators (except the row 1 comparator 12-1), in addition to being coupled to row output point 16-n, are also coupled to a current sink. These current sinks are set to draw a constant current equal to the current drawn into the current sinks coupled to the emitter junctions of the differential pairs. Therefore, for input voltages below −0.05 volts, in each row, four differential pairs are drawing current from row output point 14 and the equivalent of five differential pairs (the four other differential pairs in the given row plus the current sink) are drawing current from row output point 16-n. This causes the outputs of all the comparators to be low. However, as the input voltage increases, the voltages at nodes 36A-36H sequentially become greater than −0.05 volts and the balance of differential pairs drawing current from points 14 and 16 change.

As stated, the reference current source 44 on input resistive ladder 26 is set at the current necessary to cause the difference in voltage between adjacent nodes to be equal to one LSB (least significant bit) which, in this particular example, is 0.1 volts.

Figure 4B:
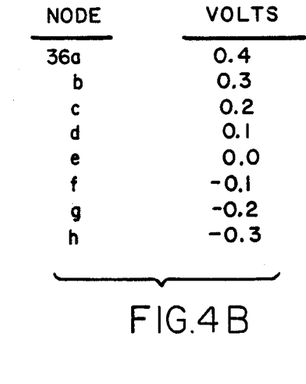

Therefore, if the input voltage is 0.4 volts for example, the voltages at 36A-36H are given in the table of FIG. 4B. It can be seen that the reference transistor base voltages in columns A-G, i.e., at nodes 40A-40G, are all still greater than any of the voltages at nodes 36A-36H and, therefore, all of the differential pairs in columns A-G remain in their original state. However, in column H, it can be seen that the voltages at nodes 36A, B, C, D and E exceed the voltage at node 40H, while the voltages at nodes 36F, 36G and 36H do not. Therefore, while the bottom three differential pairs (in rows 8-10) in column H remain in their original state, the top four differential pairs (in rows 4-7) change state because the base voltage of the input transistor now exceeds the base voltage of the reference transistor in each of those pairs. These input transistors in rows 4-7 of column H, which have their collectors coupled to the first row output point 14 of their respective rows, are now drawing more current through row output 14 than the reference transistors are drawing from (output row 16. In rows 4-7, there are now five differential pairs drawing current from row output point 14 and only three differential pairs plus the current sink (equal to the current drawn by one differential pair) drawing current from row output point 16. Therefore, in rows 4-7, more current is being drawn from the inverting input of comparators 12-4 to 12-7 than from the non-inverting input, thereby forcing the output of these comparators to go high. The logic components coupled to the outputs of comparators 12-4 through 12-10 combine these outputs to produce a Gray code output of 1 1 0 (i.e., decimal 4).

It should be clear that when the input voltage exceeds 0.45 volts, the voltage at node 36F exceeds −0.05 volts (i.e., the voltage at node 40H), causing the differential pair in column H, row 8 to change state, thereby producinq a high level at the output of the row 8 comparator 12-8. As the input voltage increases by magnitudes of an LSB, each successive differential pair in the first column will turn on until all seven differential pairs have changed state and the comparators for rows 4-10 all have high outputs.

After all seven differential pairs in column H have changed state (i.e., the input voltage has exceeded 0.65 volts), all 7 comparators have high outputs causing the Gray code output to be 000100. When the input voltage exceeds 0.75 volts, the topmost differential pair in column G, which is the differential pair in row 3, switches state. When this differential pair switches, row 3 will have three differential pairs drawing current from row output point 14-3, but only one differential pair and a current sink drawing current from row output point 16-3. This causes the output of the comparator 12-3 of row 3 to go high. The outputs of the comparators 12-4 through 12-10 remain the same. Therefore, in the Gray code encoding scheme, the output of the low three bits remains the same while bit 4 turns from low to high. This is exactly as it should be since, in Gray code, the code for 7 is 000100, while the code for 8 is 001100.

It should be obvious at this point that, when the input voltage exceeds the threshold of 0.85 volts, the differential pair in column G, row 4, which was previously conducting the majority of current through row output 14-4, switches states to draw the majority of current through row output 16-4. The change of state in this differential pair once again returns the balance of differential pairs in row 4 to four differential pairs conducting current through row output 14 and another four differential pairs plus the current sink conducting current through row output 16. Therefore, row output point 16-4 of row 4 once again conducts more current than row output point 14-4 and the output of comparator 12-4 of row 4 returns low. It should be obvious at this point that as the input crosses each LSB threshold, comparators 12-4 through 12-10 sequentially change state from low to high and, when they are all high, they begin to sequentially change state back to low. The logic circuitry comprising EXCLUSIVE-OR gates 46, 48, 50 and 52 converts the outputs of the comparators 12-4 to 12-10 to the three LSBs of the Gray code.

Referring now to rows 1-3 of the matrix, these rows are designed such that the associated comparators directly output the top three bits of the Gray code without need for any logical combination circuitry. It can be seen that row 3 comprises only four differential pairs, row 2 comprises only two differential pairs, and row 1 comprises just one differential pair. Since the bottom transistor of differential pair 54 in row 3 is coupled to node 40G, which is set at 0.75 volts, the output of comparator 12-3 will go high when the input voltage exceeds 0.75 volts. Since the bottom transistor of the next differential pair 56 in row 3 has its base coupled to node 40E, the output of comparator 12-3 will return low when the input voltage increases beyond 2.35 volts. Differential pairs 57 and 59 will cause transitions at 3.95 and 5.55 volts, respectively. It can be seen in FIG. 1 that the output of the comparator 12-3 constitutes the fourth bit of the Gray code. In Gray code, the fourth bit should change to 1 when the input exceeds 8 LSBs, should return to 0 when the input exceeds 24 LSBs, should return to 1 when the input exceeds 40 LSBs and should once again return to 0 when the output exceeds 56 LSBs. It can be seen in FIG. 1 that this is exactly how comparator 12-3 will respond to the switching of the transistors in that row. Rows 1 and 2 operate in the same manner except that the differential pairs go through the state chanqes at different specified voltage levels corresponding to how the fifth and sixth bits of the Gray code of FIG. 2 should respond.

It should be noted at this point that the converter shown in FIG. 1 can be practically implemented for full scales ranges of approximately 0.8-6.0 volts. Therefore, the preceding example, in which the full scale range was 6.3 volts, was at the upper limit of recommended full scale ranges and was chosen as an example merely because it provided an LSB value of 0.1 volts, which simplified the mathematics. The full scale range of the converter should not exceed approximately 6.0 volts since, when the input is, for example, 0 volts, the input transistor of the differential pair in column H, row 10 would be reverse biased approximately 6.0 volts (actually 6.0 volts less one base-emitter voltage). This is approximately equal to the break down voltage of the transistors used in the FIG. 1 embodiment.

Further, the minimum full scale range is approximately 0.8 volts because the matrix will not operate accurately if the LSB of the system is substantially less than approximately three or four $kT/q$. This is because the transitions of adjacent differential pairs would overlap. The above mentioned maximum and minimum limits pertain to the circuit shown in FIG. 1. Various modifications to the matrix can be made if it is desired to either increase or decrease the full scale range of the converter.

Figure 5:
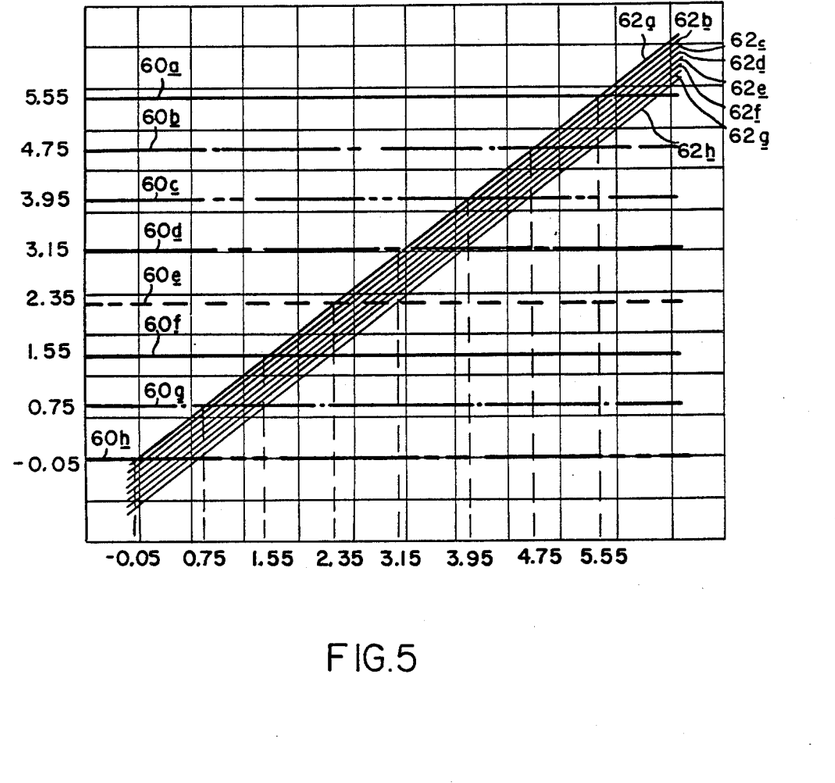
FIG. 5 is a plot of the relation of the base voltages of the transistors in the matrix with respect to the input voltage.

The plot of base voltages of the transistors versus the output voltage shown in FIG. 5 should help to illustrate the theory behind the operation of the matrix. The base voltages of the transistors having bases coupled to nodes 40A–40H are given by lines 60A–60H, respectively. Since the reference voltages are constant and are unaffected by changes in the input voltage, these lines are horizontal on the plot. The base voltages of the transistors having bases coupled to nodes 36A–36H are given by lines 62A–62H, respectively. These voltages, of course, increase linearly with, and at the same rate as, the input voltage. The points where lines 62 intersect lines 60 define threshold points at which the corresponding differential pairs change states. It can be seen in FIG. 5 that, as the input voltage increases (as a point is moved horizontally from left to right on the plot), lines 62A–62H sequentially cross the threshold defined by line 60H. These threshold crossings correspond to the sequential switching of the differential pairs in the first column as the node voltages of the input ladder exceed the −0.5 mV threshold of node 40H (i.e., line 60H). It should be noted that the very first threshold crossing, that of line 62A with line 60H does not cause a differential pair to switch since no differential pair has a base coupled to node 36A in column H. Column H, however, is the only column which does not have a differential pair coupled to node 36A.

As we move one more LSB to the right from the point where line 62H intersects line 60H, the next intersection is line 62A intersecting line 60G. This comprises the first state change in the next column, column G.

The differential pair matrix of FIG. 1 is merely and example and various alterations should be obvious therefrom. For instance, resolution may be increased by adding rows or columns to the matrix and altering the combinatorial logic. Further, various different types of matrices comprising various numbers of rows and columns are possible for any given resolution. Even further, different row configurations are possible, such as is illustrated by the difference between rows 1–3 and rows 4–10 in FIG. 1.

Even further adaptations of the matrix are possible. For example, the matrix may be adapted to accept a differential voltage as its input. In such an instance, the reference resistive ladder would merely be replaced with another input resistive ladder similar to the first one in FIG. 1. Various other modifications too numerous to mention are also possible.

Figure 6:
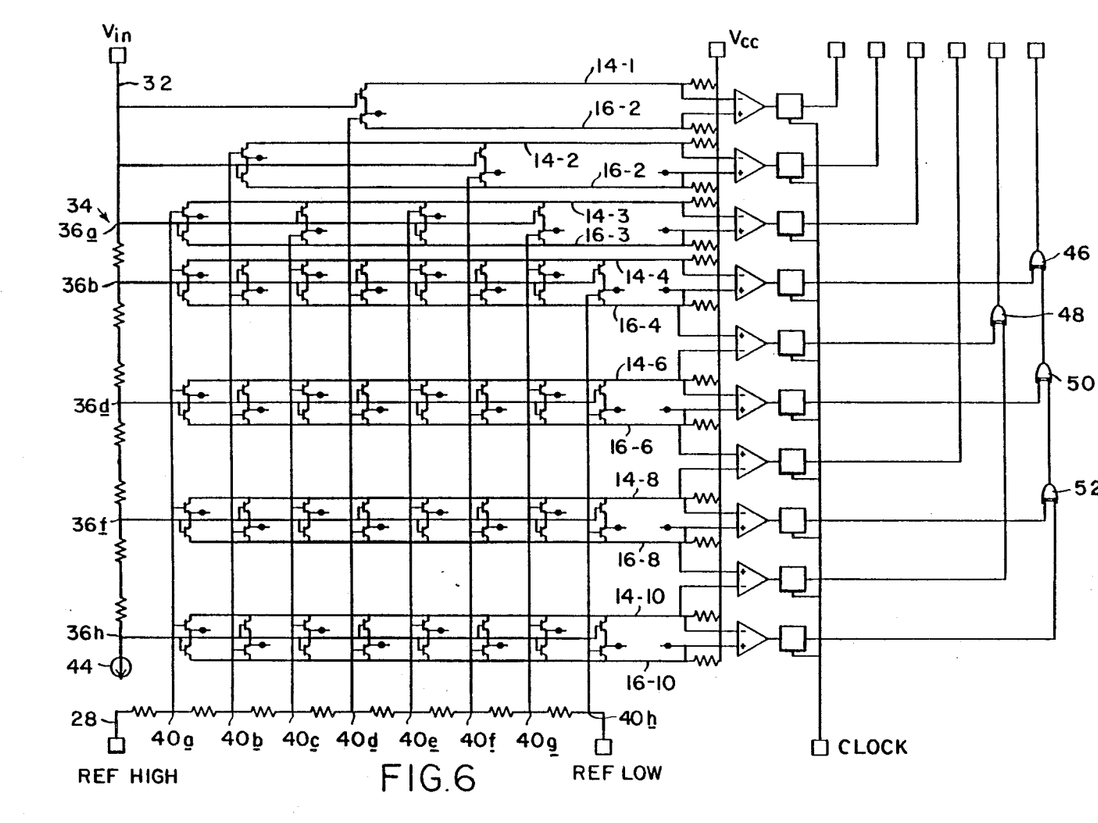
FIG. 6 is a schematic circuit diagram of a second embodiment of the parallel analog-to-digital converter of the present invention.

In the embodiment in FIG. 1, it is noted that $2^n-1$ differential pairs are used to produce $2^n$ distinct levels, i.e., n bits of resolution. However, FIG. 6 illustrates that entire rows of the matrix can be eliminates yet the matrix can still produce the same amount of resolution or, alternatively, the resolution can be increased without adding any new differential pairs. FIG. 6 shows an embodiment in which every other row of rows 4–10 of the matrix is eliminated. In the FIG. 1 embodiment of the invention, the inputs of each comparator are coupled to the first and second row output points of each row of differential pairs. In the embodiment of FIG. 6, however, every other row is eliminated and comparators are provided between adjacent rows of differential pairs. The second row output point 16 of each row is compared with the first row output point 14 of the succeeding row. The outputs of the ten comparators shown in FIG. 6 in response to an input voltage are exactly the same as the response of the circuit shown in FIG. 1. The plot shown in FIG. 7 illustrates the operation of this circuit.

FIG. 7 shows the collector currents of three consecutive differential pairs in a column of the matrix of FIG. 1 plotted against the input voltage. These may be differential pair 55, 57 and 59 in column H of FIG. 1, for example. Plot W55 in FIG. 7A shows the collector current of the reference transistor of differential pair 55 while W55 shows the collector current of the input transistor of differential pair 55. Similar plots are also shown for differential pairs 57 and 59 in FIGS. 7B and 7C. Continuing with the example developed in relation to FIGS. 1–4, when the input voltage gets very close to the −0.5 mV switching voltage of differential pair 55, the current W55 starts to increase while the current W55 starts to decrease. At exactly −0.5 mV, W55 and W55 cross thereby causing the differential pair to change state. As the input increases past −0.5 mV, W55 continues to increase and W55 continues to decrease for a short period afterwards at which point the currents level off. The collector currents in differential pairs 57 and 59 behave similarly except that the threshold where the collector currents are equal are at 0.5 mV and 1.5 mV, respectively. Thereby, by comparing W55 with W55, W57 with W57 and W59 with W59, the corresponding comparators are made to change state when their respective current levels intersect in FIGS. 7A, 7B and 7C. By properly selecting the resistors in the input and resistive ladders, these points of intersection are spaced the desired LSB apart from each other.

Figure 7A:
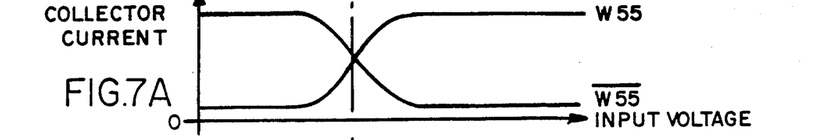
FIGS. 7A, 7B, 7C and 7D are plots of the row outputs of various rows of the matrix converter of the present invention.
Figure 7B:
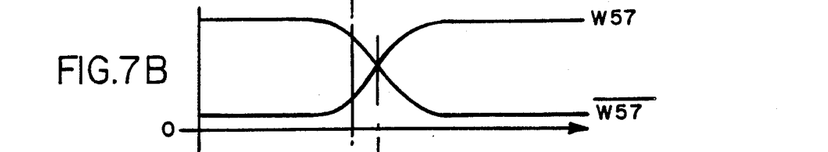
Figure 7C:
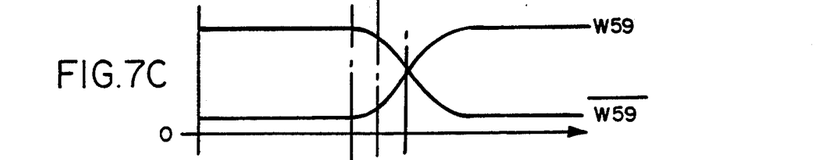
Figure 7D:
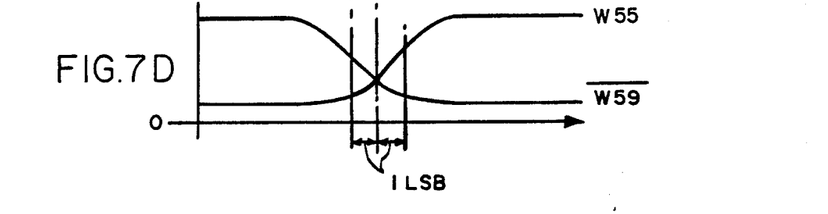

FIG. 7D shows W55 superimposed with plot W59. It can be seen that these two signals intersect at 0.5 volts (i.e., halfway between −0.5 and 1.5 volts), i.e., the threshold which is also defined by the intersection of W57 with W57. Therefore, if W55 (the second row output of row 4, 16-4) is compared with W59 (the first row output of row 6, 14-6), differential pair 57 is no longer necessary to define that threshold. A bonus threshold is thereby provided between each row of differential pairs. In fact, the entire row 5 can be eliminated from the circuit as is shown by FIG. 6. It should be noted a this point that W55 and W59 also intersect at the exact same point as W55 and W59. Therefore, either of these pairs of currents can be compared to provide the bonus threshold.

There are various alternative embodiments of the invention. The particular embodiment which is most desirable would depend on the application of the converter. For instance, if savings in costs and semiconductor area are particularly important, various ways of further reducing the number of rows of differential pairs for any specified resolution should be made obvious to a person skilled in the art by the above disclosure. Also, there are various ways to improve accuracy.

In the embodiment of FIG. 6, if the collector-emitter path currents of the transistors of a given row are not perfectly matched with the transistors of the adjacent rows, the bonus threshold between those two rows will be offset from its ideal position. For instance, in FIG. 7, if collector currents W55 and W55 are not equal in magnitude to collector currents W57 and W57, then W55 and W57 will intersect at the wrong input voltage, causing the bonus threshold to occur at the wrong input voltage.

FIGS. 9A, 9B, 9C and 9D show four alternate embodiments of circuitry which can be added between the row output signals and the comparators associated with the bonus thresholds to improve accuracy in defining the bonus thresholds. These circuits essentially comprise front ends for the bonus threshold comparators. All of these circuits show various ways of combining first row output point 14-n with succeeding first row output point 14-n+1 and second row output point 16-n with succeeding second row output point 16-n+1, and comparing the two "combination" signals obtained thereby with each other. By combining the signals from rows n and n+1 appropriately, any mismatch between the transistors of the rows can be factored into both "combination" signals, thereby preventing the mismatch from altering the input voltage at which the threshold occurs. What will be altered is the magnitude of the collector currents at the point of intersection (i.e., the point of intersection may be displaced vertically in the plot of FIG. 7), but not the input voltage at which it occurs (i.e., the point of intersection will not be displaced horizontally in the plot of FIG. 7). FIGS. 9A, 9B, 9C and 9D show four example combining circuits to improve the accuracy of the placement of the bonus thresholds.

Other alternate embodiments are possible in which even more rows of the matrix are eliminated. For instance, combining circuitry, such as is shown in the Appendix, can be adapted to output more than simply one mid-point (average) between two adjacent rows, but to provide any number of equally spaced points between the adjacent rows. Such combining circuits should be obvious to a person skilled in the relevant art in view of this application.

It is also possible to implement the present invention using only one of the row output points of each row in the matrix. Instead of comparing the first row output point with the second row output point of a given row, either row output point can simply be compared with a constant threshold voltage which is set to be equal to the voltage at which the designated row output point will be when the input voltage is at the desired threshold point. The bonus thresholds can be obtained in the same general manner except that, instead of simply comparing one of the row outputs with the threshold voltage, the average of two adjacent row outputs are compared with the threshold voltage.

It should be understood that the bonus threshold invention illustrated in FIGS. 6 and 7 is not limited to use with the differential pair matrix of FIG. 1, but can be used with any type of circuitry which produces signals which behave generally as shown in FIG. 7.

Figure 8A:
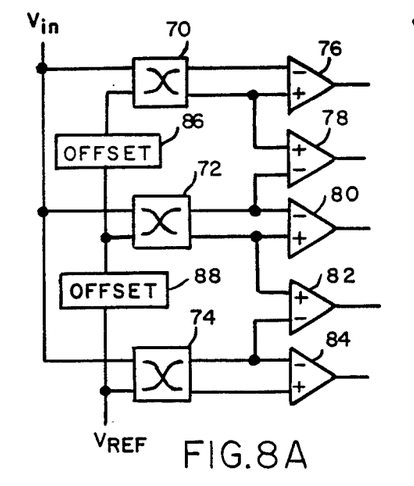
FIGS. 8A and 8B are partially schematic and partially block diagrams of alternate embodiments of the parallel analog-to-digital converter of the present invention.
Figure 8B:
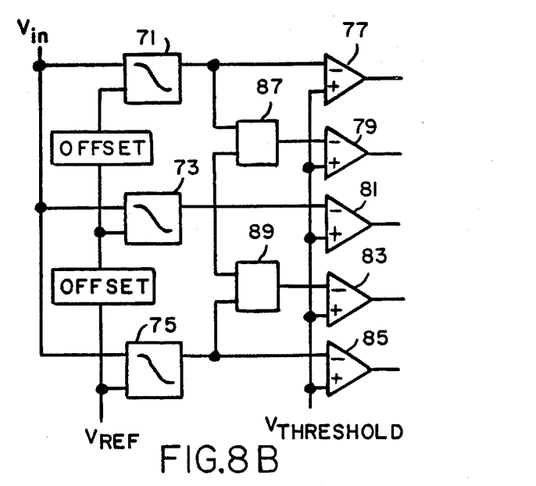
Figure 9A:
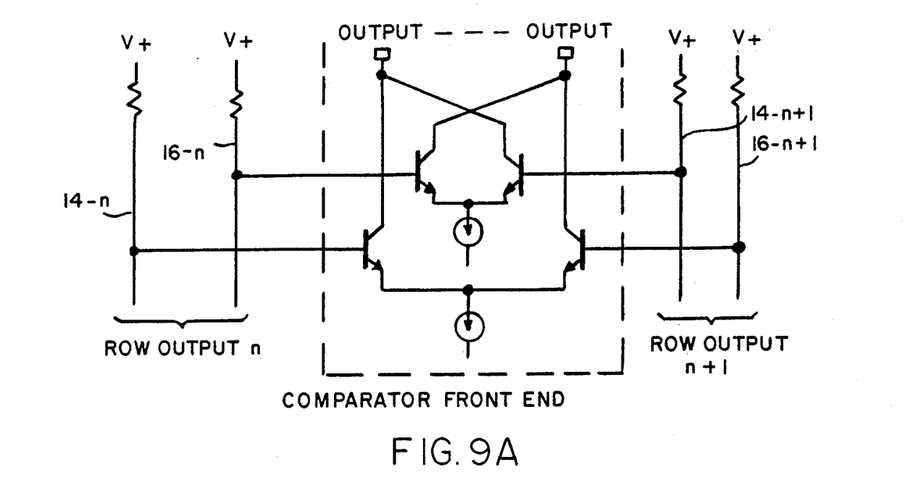
FIGS. 9A, 9B, 9C and 9D are schematic diagrams of alternate embodiments of the front end of the comparators of the present invention.
Figure 9B:
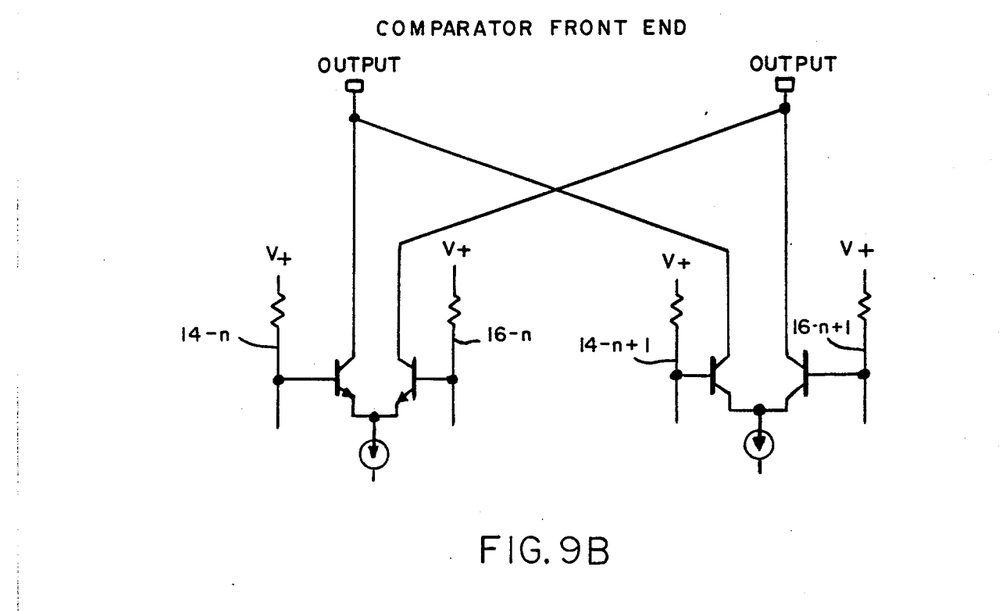
Figure 9C:
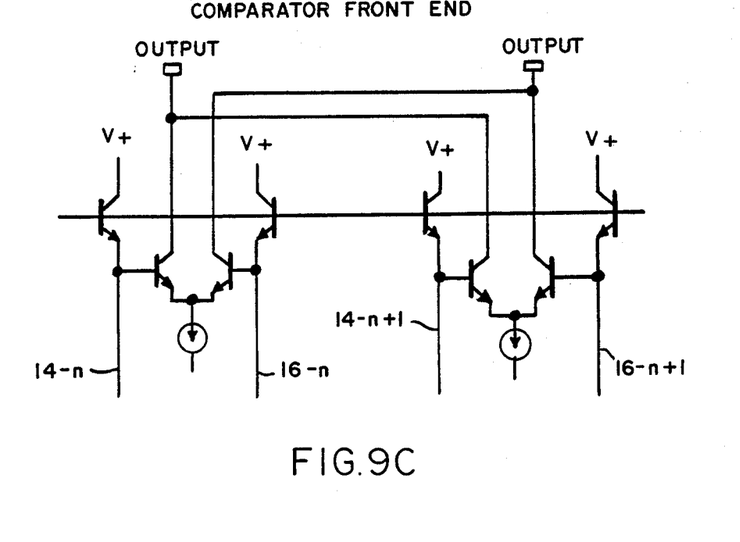
Figure 9D:
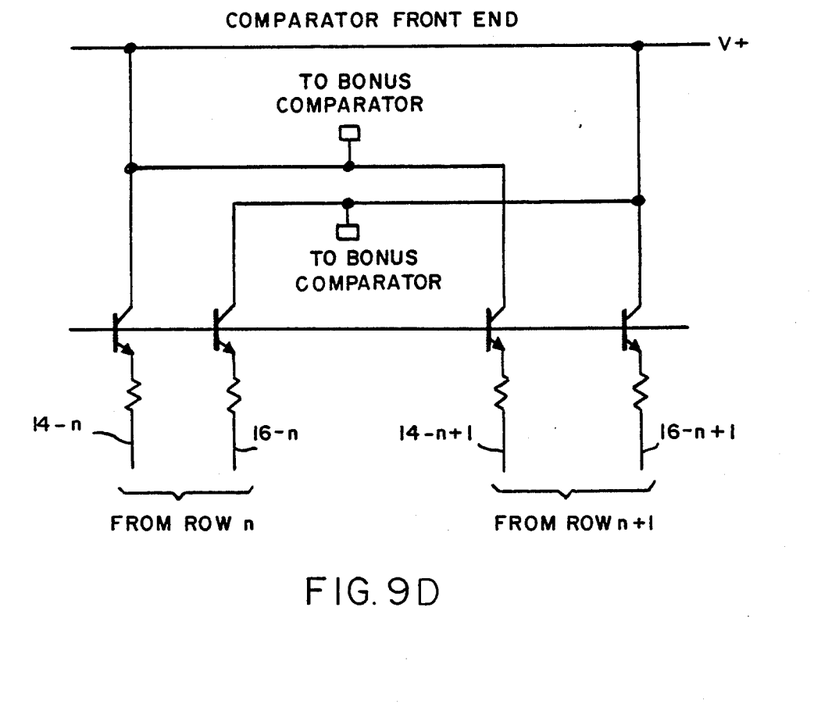

FIGS. 8A and 8B illustrate the broader concept of the bonus threshold invention of FIG. 7. In FIG. 8A, blocks 70, 72 and 74 represent circuitry which can output a signal, in response to the input signal, that behaves generally as shown in the plot of FIG. 7. These blocks may comprise individual rows of differential pairs as shown in FIGS. 1 and 6, single differential pairs, or any other circuitry having the desired output characteristic. The desired output of these blocks, as described above, comprises two signals which are substantially stable for most voltage levels except voltage levels surrounding a specified threshold voltage or voltages. The threshold voltages of successive ones of circuit blocks 70, 72 and 74 are separated by the desired LSB of the converter, for example, by offset blocks 86 and 88. In the range of voltages surrounding the threshold voltage for each block, the two output signals of each block ramp towards each other, intersect, and ramp away from each other until they reach their stable maximum or minimum level. Comparators 76, 80 and 84 compare the two output lines of each block 70, 72 or 74 with each other. Comparators 78 and 82 compare the second output line of one of the blocks with the first output line of the succeeding blocks.

FIG. 8B broadly illustrates the embodiment of the invention wherein only a single output signal is necessary for each block. Blocks 71, 73 and 75 represent circuitry having the desired output characteristics in response to the input signal (and a series of reference voltages Once again, these blocks may represent individual rows of differential pairs or single differential pairs in which only one of the row outputs is taken as an output signal. Comparators 77, 81 and 85 compare the output signals of blocks 71, 73 and 75, respectively, with a specified threshold voltage. Blocks 87 and 89 comprise electronic combining circuitry which accept two or more input signals and produce an output which is a specified function of its input signals (such as an average). Various circuits are known for providing such responses, some of which are suggested in the Appendix. Circuits 87 and 89 may, for instance, comprise averagers which simply output the average of the two input signals. Comparators 79 and 83 then compare the outputs of circuits 87 and 89, respectively, with a specified threshold voltage.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for converting an analog input signal to a digital output signal comprising:
   means for producing a plurality of successive pairs of row output signals, each pair comprising a first and a second row output signal, each of said pairs of row output signals responsive to said analog input signal such that, over at least one specified voltage range of the analog input signal, said first row output signals gradually transition from a first stable level to a second stable level and said second row output signals gradually transition from said second stable level to said first stable level similarly but inversely to said first row output signal, and wherein said specified voltage range associated with each successive pair of row output signals is greater than the specified voltage range associated with a preceding one of said successive pairs of row output signals by twice the value of a least significant bit of said apparatus,
   means for comparing the first row output signal to the second row output signal for each of the pairs of row output signals,
   means for comparing one of the first and second row output signals of each pair of row output signals with one of the second and first tow output signals, respectively, of a succeeding one of said successive pairs of row output signals, and means for producing an output signal in response to each comparison that is in a first state if the first mentioned signal of the comparison exceeds the second mentioned signal and in a second state otherwise.

2. An apparatus as set forth in claim 1 further comprising logic circuitry means for converting the output signals into a Gray code.

3. An apparatus as set forth in claim 2 wherein said means for comparing comprise comparators having first and second inputs and an output.

4. An apparatus as set forth in claim 3 wherein the means for producing each of the plurality of row output signal pairs comprises at least one pair of differentially coupled transistors, comprising a first and a second transistor wherein the emitters of said first and second transistors are coupled to a constant current sink, the collector of said first transistor is coupled to said first input of said comparator, the collector of said second transistor is coupled to said second input of said comparator, the base of said first transistor is coupled to a reference voltage and the base of said second comparator is coupled to receive a representation of the input voltage, and wherein the representation of the input voltage is the input voltage minus a specified offset value, where the offset value for each successive at least one differential pair is X greater than the preceding at least one differential pair, where X is two LSBs of the apparatus.

5. An apparatus as set forth in claim 4 wherein each of said at least one differential pairs comprises a row of successive differential pairs, comprising first and second transistors, wherein the emitters of all transistors in said row are coupled to current sinks, the collectors of the first transistor of each differential pair in said row are coupled to the first input of said comparator, the collectors of the second transistor of each differential pair in said row are coupled to the second input of said comparator, the bases of the first transistors of said successive differential pairs are alternately coupled to (1) every other one of a plurality of successive reference voltages and (2) said offset input voltage, and the base of said second transistors of each differential pair of said successive differential pairs are alternately coupled to (1) said offset input voltage and (2) every other one of the plurality of successive reference voltages, and wherein the plurality of reference voltages comprises a series of successive reference voltages such that each succeeding reference voltage is greater than the preceding reference voltage by a specified value.

6. An apparatus as set forth in claim 5 wherein the plurality of reference voltages are provided by a resistive ladder having a constant voltage source coupled in series therewith.

7. An apparatus as set forth in claim 4 wherein the representations of the input voltage are provided by a resistive ladder having the input voltage signal coupled thereto and a constant current source in series therewith.

8. An apparatus as set forth in claim 7 wherein a constant current source is adapted to draw a current through said input resistive ladder that will cause the representations of the input voltage to be spaced apart by a voltage equivalent to two LSBs of the apparatus.

9. An apparatus for converting an analog input signal to an n-bit digital signal, said apparatus comprising:

means for producing $2^n/2$ consecutive comparison signals, each of said $2^n/2$ comparison signals responsive to said analog input signal such that, over at least one specified voltage range of said analog input signal, said output signal gradually transitions from a first stable level to a second stable level, wherein said specified voltage range associated with each of said consecutive comparison signals are spaced apart by twice the value of the least significant bit of said apparatus;

means for averaging said output signals, said averaging means having a plurality of first inputs, each coupled to receive one of said consecutive comparison signals and a second input coupled to receive a succeeding one of said consecutive comparison signals and an output that is the average of the signals at said first and second inputs; and comparing means having a plurality of first inputs for receiving each of said comparison signals and each of said averaging means outputs, and at least one second input for receiving a threshold voltage having a value between said first and second specified voltages, said comparing means producing an output signal associated with each of the first inputs, said output signal being in a first state if the threshold voltage is less than the associated first input and in a second state otherwise.

10. An apparatus as set forth in claim 9 further comprising logic means coupled to receive said output signals, said logic means converting said output signals into a Gray code.

11. An apparatus as set forth in claim 10 wherein said means for producing $2^n/2$ consecutive comparison signals comprises $2^n/2$ consecutive comparators, each having a first input coupled to receive said analog input voltage and a second input coupled to received a reference voltage, wherein the reference voltage associated with each of said comparators is spaced two least significant bits apart from the consecutively adjacent comparators.

12. An apparatus as set forth in claim 11 wherein said averaging means comprises $(2^n/2)-1$ consecutive averaging means.

13. An apparatus as set forth in claim 12 wherein said comparing means comprises $n-1$ comparators, each having a first input coupled to receive one of said comparison signals or averaging means outputs and a second input coupled to receive said threshold voltage.

14. An apparatus as set forth in claim 13 wherein said reference voltages are provided by a resistive ladder.

* * * * *